United States Patent [19]

Nakano

[11] Patent Number: 4,603,264
[45] Date of Patent: Jul. 29, 1986

[54] SCHMITT TRIGGER CIRCUIT WITH STABLE OPERATION

[75] Inventor: Masaji Nakano, Tokyo, Japan

[73] Assignee: NEC Corporation, Tokyo, Japan

[21] Appl. No.: 563,567

[22] Filed: Dec. 20, 1983

[30] Foreign Application Priority Data

Dec. 20, 1982 [JP] Japan .................. 58-192658[U]

[51] Int. Cl.⁴ .................. H03K 3/356; H03K 3/295
[52] U.S. Cl. .................. 307/290; 307/279; 307/360
[58] Field of Search .................. 307/290, 279, 360

[56] References Cited

U.S. PATENT DOCUMENTS

| | | | |
|---|---|---|---|
| 3,512,010 | 5/1970 | Washburn | 307/290 |
| 3,666,970 | 5/1972 | Abbott et al. | 307/290 |
| 3,952,213 | 4/1976 | Fukaya | 307/290 |
| 4,023,122 | 5/1977 | Oura | 307/290 |
| 4,464,587 | 8/1984 | Suzuki et al. | 307/290 |
| 4,506,168 | 3/1985 | Uya | 307/290 |

*Primary Examiner*—John S. Heyman
*Attorney, Agent, or Firm*—Burns, Doane, Swecker and Mathis

[57] ABSTRACT

A stably operating Schmitt trigger circuit is formed by connecting in parallel a series circuit comprising a first inverter having high threshold voltage and a first switch to another series circuit comprising a second inverter having low threshold voltage and a second switch, making one ends of the series circuits an input terminal, and connecting the other ends to an output terminal through a third inverter, wherein the first switch is allowed to conduct when the electric potential at the output terminal is low and the second switch is allowed to conduct when the potential at the output terminal is high.

7 Claims, 3 Drawing Figures

SCHMITT TRIGGER CIRCUIT WITH STABLE OPERATION

BACKGROUND OF THE INVENTION

1. Field of the Invention

This invention relates to a Schmitt trigger circuit comprising inverters employing MOS field effect transistors (hereinafter referred to as MOS FET's).

2. Description of the Prior Art

When an input signal having slow rise and fall times is applied to a logic circuit, chattering may occur at the input stage. In order to prevent the chattering, the input signal is given to the logic circuit through the so-called Schmitt trigger circuit having hysteresis characteristics.

As the Schmitt trigger circuit, use has been made of the circuit shown in FIG. 1 wherein inverters 10 and 11 are connected in series between input and output terminals 13 and 14 and the output of the inverter 11 is fed back to the input of the inverter 11 through another inverter 12. The electric potential at the output point of the inverter 10 is determined by that at the output point of the inverter 12. The turn-off level $V_{IL}$ at the input terminal 13 is the value at which the voltage of the output terminal 14 changes from high to low levels; it is the value which can force the output of the inverter 12 to change from low to high levels with the output of the inverter 10. Similarly, the turn-on level $V_{IH}$ at the input terminal 13 is what can force the output of the inverter 12 to change from high to low levels with the output of the inverter 10. Since these values of the turn-off level $V_{IL}$ and the turn-on level $V_{IH}$ are different, the circuit in FIG. 1 operates as a Schmitt trigger circuit.

The turn-off and turn-on levels $V_{IL}$ and $V_{IH}$ are determined by the output impedances of the inverters 10, 12. In more detail, when the output impedance of the inverter 10 becomes smaller than that of the inverter 12, the output at the output terminal 14 turns to high or low level. Those output impedances depend on the characteristics of transistors constituting the inverters 10, 12 which have an inevitable manufacturing error. This makes it hard to control the turn-off and turn-on levels $V_{IL}$ and $V_{IH}$.

Since each of the inverters 10, 11 and 12 is of the so-called CMOS type with a circuit formed of P-channel and N-channel type MOS FETs connected in series between power supply terminals, the power consumed in the Schmitt trigger circuit is very small. If, however, the output impedance of the N-channel type MOS FET (or P-channel type MOS FET) of the inverter 10 is not small sufficient to force the output of the inverter 12 to change, the circuit in FIG. 1 will no longer operate as a Schmitt trigger circuit. If the output impedance of the inverter 12 is not large compared to that of the inverter 10, the same maloperation will occur. These phenomena may be derived from manufacturing errors during the process of manufacturing transistors or otherwise caused when the circuit is exposed to gamma ($\gamma$) rays as in the case of its use in an earth satellite.

SUMMARY OF THE INVENTION

An object of the present invention is to provide a Schmitt trigger circuit which operates stably despite variations in characteristics of transistors.

The Schmitt trigger circuit in accordance with the present invention comprises an input terminal; a first inverter with its input point connected to the input terminal and having high threshold voltage; a second inverter with its input point connected to the input terminal and having low threshold voltage; and output terminal; a third inverter with its output point connected to the output terminal, a first switch connected between the output point of the first inverter and the input point of the third inverter and its control electrode connected to the output terminal, the first switch turning on in response to a low level of the output at the output terminal; and a second switch connected between the output point of the second inverter and the input point of the third inverter and its control electrode connected to the output terminal, the second switch turning on in response to a high level of the output at the output terminal.

In the Schmitt trigger circuit thus arranged, the turn-on level $V_{IH}$ is determined by the threshold voltage of the first inverter, whereas the turn-off level $V_{IL}$ is determined by the threshold voltage of the second inverter. For this reason, the turn-off and turn-on levels $V_{IL}$ and $V_{IH}$ do not depend on the output impedances and are readily controlled. Moreover, even if the threshold voltage of each inverter changes, the circuit will not cease to operate as a Schmitt trigger circuit. The Schmitt trigger circuit in accordance with the present invention is favorably composed of CMOS type inverters with a small power consumption, because the turn-off and turn-on levels $V_{IL}$ anf $V_{IH}$ may be controlled by adjusting the threshold levels of the first and second inverters. This may be possible by various methods, for example by adding a voltage attenuator in front of the first and/or second inverter, by changing the ratio of channel lengths of the P and N channel type MOS FET's or by changing the thickness of the gate insulator in the P and/or N channel type MOS FET.

BRIEF DESCRIPTION OF DRAWINGS

The above and further objects, features and advantages of the present invention will become more apparent from the following detailed description taken in conjunction with accompanying drawings, wherein.

DESCRIPTION OF THE PREFERRED EMBODIMENTS

Figure 1:
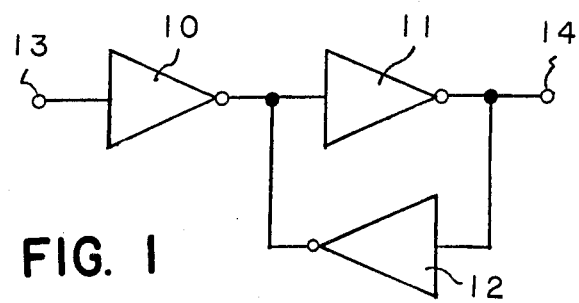
FIG. 1 is a block diagram of a conventional Schmitt trigger circuit.
Figure 2:
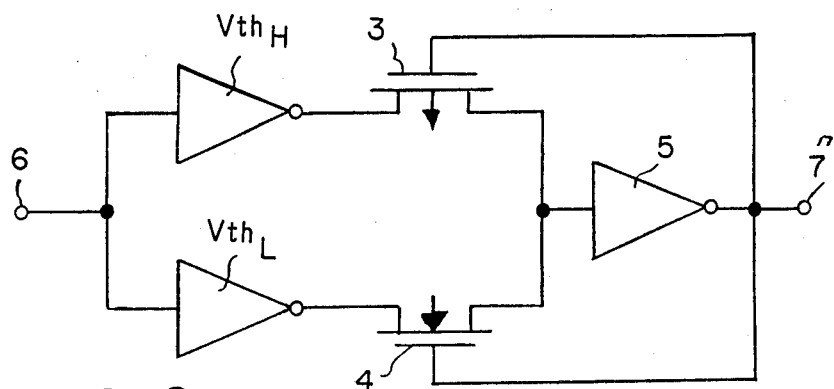
FIG. 2 illustrates a Schmitt trigger circuit of a preferred embodiment according to the present invention.
Figure 3:
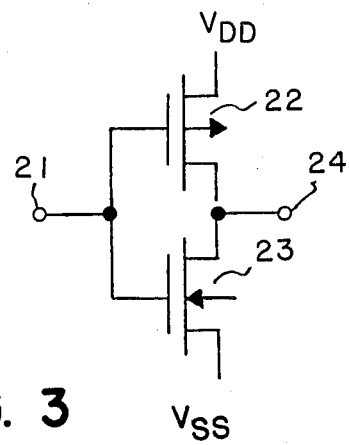
FIG. 3 is the circuit diagram of the inverter adoped into the embodiment of FIG. 2.

Referring now to FIG. 2 the Schmitt trigger circuit according to a preferred embodiment of the present invention comprises an inverter 1 having a high threshold voltage and an inverter 2 with a low threshold voltage. Input points of those inverters 1 and 2 are connected to an input terminal 6. The output of the inverter 1 is applied to the input point of an inverter 5 through a P channel type MOS FET 3, whereas the output point of the inverter 2 is connected to the input point of the inverter 5 through an N channel type MOS FET 4. The output of the inverter 5 is connected to an output terminal 7 and the gates of the P channel MOS FET 3 and the N channel MOS FET 4 are also connected to the output terminal 7. Each of the inverters 1, 2 and 5 is of the CMOS type as shown in FIG. 3; that is, a P channel type MOS FET 22 and an N channel type MOS FET 23 are connected in series between power source terminals $V_{DD}$ and $V_{SS}$, and their gates and drains being connected to a common input point 21 and a common output 24, respectively.

The operation of the circuit will be described hereinafter.

Assuming that $V_I$ is an input signal; $Vth_H$, the threshold voltage of the inverter 1 which has a high threshold voltage; $V_1$, the output voltage of the inverter 1; $Vth_L$, the threshold voltage of the inverter 2 which has a low threshold voltage; $V_2$, the output voltage of the inverter 2; $V_3$, input voltage to the output inverter 5; $V_0$, the output voltage of the output inverter 5 and $V_{DD}$ power supply voltage, when the input signal $V_I$ rises, (1) in the range of $0<V_I<Vth_L$, the output voltage $V_0$ is at low level (0V) because the input voltage $V_3$ is allowed to have a high level due to the fact that the output voltages $V_1$ and $V_2$ are at high levels ($V_{DD}$) and the P channel type MOS FET 3 is conducting;

(2) in the range of $Vth_L<V_I<Vth_H$, the output voltage $V_0$ remains at low level while the input voltage $V_3$ is at high level due to the fact that the output voltage $V_1$ is at high level and the output voltage $V_2$ is at low level and the P channel type MOS FET 3 is conducting while the N channel type MOS FET 4 is non-conducting; and (3) in the range of $Vth_H<V_I<V_{DD}$, the input voltage $V_3$ changes to have a low level due to the fact that both the output voltages $V_1$ and $V_2$ are at low levels and the N channel type MOS FET 4 is conducting while the P channel type MOS FET 3 is non-conducting, and accordingly the output voltage $V_0$ is inverted to the high level contrary to the cases (2) and (3).

When the input signal $V_I$ falls from the value higher than $Vth_H$, (4) in the range of $V_{DD}<V_I<Vth_H$, the output voltage $V_0$ keeps at high levels because the input voltage $V_3$ keeps at low levels due to the fact that the output voltages $V_1$ and $V_2$ are at low levels and the N channel type MOS FET 4 is conducting;

(5) in the range of $Vth_H<V_I<Vth_L$, the input voltage $V_3$ remains at low levels due to the fact that the output voltage $V_1$ is at high level and the output voltage $V_2$ is at low level and the N channel type MOS FET 4 is conducting while the P channel type MOS FET 3 is non-conducting, and accordingly the output voltage $V_0$ remains at high level; and (6) in the range of $Vth_L<V_I<0$, the input voltage $V_3$ changes to high level due to the fact that output voltages $V_1$ and $V_2$ are at high levels and the P channel type MOS FET 3 is conducting while the N channel type MOS FET 4 is non-conducting, and accordingly the output voltage $V_0$ changes to have a low level.

As explained, the circuit shown in FIG. 2 operates as a Schmitt trigger circuit having a hysteresis range $Vth_H$-$Vth_L$ with the threshold voltage $Vth_H$ of the inverter 1 as a turn-on level $V_{IH}$ and the threshold voltage $Vth_L$ of the inverter 2 as a turn-off level $V_{IL}$. The threshold voltages $Vth_H$ and $Vth_L$ of the inverters 1 and 2 can freely be set, for example, by changing a ratio of the dynamic resistance between the source and the drain of the P channel type MOS FET 22 to that of the N channel type MOS FET 23 constituting the CMOS type inverter. In other words, the ratio of the channel length of the FET 22 to that of the FET 23 may be used to control the threshold voltage of the inverter. This control can be simply achieved in the manufacturing process by merely adjusting the dimensions of the source, drain and channel regions in the diffusion mask. It is very easy if compared with the prior art in which the turn-on and turn-off levels are adjusted by controlling the output impedances of the inverters 10 and 12. The threshold voltages $Vth_H$ and $Vth_L$ may be changed by adjusting the thicknesses of the gate insulators of the P and N channel type MOS FET's 22 and 23. The later measure, however, is not suitable where the Schmitt trigger circuit is formed in an integrated circuit. Another measure for adjusting the threshold voltages is to add an attenuator and an amplifier, respectively, in front of the inverters 1 and 2. The threshold voltages $Vth_L$ and $Vth_H$ may vary when the electrical characteristics of the MOS FET's constituting the inverters 1, 2 and 5 change due to an exposure to gamma rays, manufacturing errors and so on, but the Schmitt trigger circuit will never fail to function as it should do. The Schmitt trigger circuit changes its turn-on and turn-off levels only.

Obviously, the circuit in the above-mentioned preferred embodiment of the invention will operate in the same manner if the P channel type MOS FETs and the N channel type MOS FETs are replaced with PNP type bipolar transistors and NPN type bipolar transistors, respectively, or if the P channel type MOS FETs and the N channel type MOS FETs are mutually rearranged with a change of the power supply voltage $V_{DD}$ to have negative polarity.

What is claimed is:

1. A Schmitt trigger circuit comprising:
    an input terminal;
    an output terminal;
    a first inverter having an input point connected to said input terminal and having a first threshold voltage;
    a second inverter having an input point connected to said input terminal and having a second threshold voltage which is lower than said first threshold voltage;
    a third inverter having an output point connected to said output terminal;
    a first switch means coupled between the output of said first inverter and the input point of said third inverter, said first switch means having a control electrode which receives an electric signal at said output terminal and operates to become conductive when the electric potential of said output terminal goes below a low threshold; and
    a second switch means coupled between the output point of said second inverter and the input point of said third inverter, said second switch means having a control electrode which receives the electric signal at said output terminal and operates to become conductive when the electric potential of said output terminal goes above a high threshold.

2. A Schmitt trigger circuit as claimed in claim 1, wherein each of said first, second and third inverters has a series connection of the source/drain path of a P channel type insulated gate field effect transistor and the source/drain path of an N channel type insulated gate field effect transistor, an input point connected with the gate electrodes of said P and N channel type insulated gate field effect transistors, and an output point connected with a circuit portion between said source/drain paths of said P channel type and N channel type insulated gate field effect transistors.

3. A Schmitt trigger circuit as claimed in claim 2, wherein said first and second switch means are P channel type and N channel type insulated gate field effect transistors, respectively.

4. A Schmitt trigger circuit comprising:
an input terminal for receiving an input signal;
an output terminal for outputting an output signal having low and high levels;
a first inverter having an output point connected to said output terminal;
a first circuit including a second inverter and a first switch connected in series between said input terminal and the input point of said first inverter, said second inverter having a first threshold voltage and inverting said input signal when the voltage of said input signal is higher than said first threshold voltage, and said first switch becoming conductive in response to said low level of said output signal to apply said inverted input signal to said first inverter; and
a second circuit including a third inverter and a second switch connected in series between said input terminal and the input point of said first inverter, said third inverter having a second threshold voltage which is lower than said first threshold voltage and inverting said input signal when the voltage of said input signal is lower than said second threshold voltage, and said second switch becoming conductive in response to said high level of said output signal to apply said inverted input signal to said first inverter.

5. A Schmitt trigger circuit as claimed in claim 4, wherein said inverter and said first and second inverter circuits are respectively formed with at least two transistors connected in series, said transistors being different in conductivity, an input point connected with the input electrodes of said transistors and an output point connected with output electrodes of said transistors.

6. A Schmitt trigger circuit as claimed in claim 5, wherein said transistors different in conductivity are P channel type and N channel type field effect transistors.

7. A Schmitt trigger circuit as claimed in claim 6, wherein said first and second switches are P channel type and N channel type field effect transistors, respectively.

* * * * *